United States Patent
Maruyama et al.

(10) Patent No.: US 9,130,569 B2
(45) Date of Patent: Sep. 8, 2015

(54) CONTROLLER FOR LOAD CIRCUIT

(75) Inventors: Akinori Maruyama, Susono (JP); Keisuke Ueta, Susono (JP); Yoshihide Nakamura, Susono (JP); Yoshinori Ikuta, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/342,043

(22) PCT Filed: Aug. 28, 2012

(86) PCT No.: PCT/JP2012/071687
§ 371 (c)(1),
(2), (4) Date: May 6, 2014

(87) PCT Pub. No.: WO2013/031763
PCT Pub. Date: Mar. 7, 2013

(65) Prior Publication Data
US 2014/0247085 A1    Sep. 4, 2014

(30) Foreign Application Priority Data

Sep. 1, 2011   (JP) ................ P2011-190288

(51) Int. Cl.
*H03K 17/687*   (2006.01)
*H02M 1/088*   (2006.01)
(Continued)

(52) U.S. Cl.
CPC .............. *H03K 17/6871* (2013.01); *H02J 1/10* (2013.01); *H02M 1/088* (2013.01); *H02H 3/087* (2013.01); *H02M 2001/327* (2013.01)

(58) Field of Classification Search
CPC .......... B60N 2/0232; B60Q 1/46; B60Q 1/52; B60R 16/02; B60R 16/0232; B60R 16/03; G01R 31/04; G06F 1/26; H01H 47/00; H01H 47/04; H01H 47/325; H02H 3/08; H02H 1/04; H02H 3/085; H02H 1/06; H02H 3/00; H02H 3/087; H02H 5/04; H02H 5/041; H02H 6/00; H02H 6/005; H02H 7/08; H02H 7/18; H02H 7/228; H02H 7/30; H02J 1/00; H02J 1/10; H02J 13/00
USPC ............. 327/427, 434; 340/471, 593; 361/31, 361/79, 87, 93.8, 100, 194
See application file for complete search history.

(56) References Cited

U.S. PATENT DOCUMENTS 5,220,207 A * 6/1993 Kovalcik et al. ................ 327/63
6,002,226 A * 12/1999 Collier-Hallman et al. ........................ 318/400.23
(Continued)

FOREIGN PATENT DOCUMENTS

JP    H04-172962 A    6/1992
JP    H05-003289 A    1/1993
(Continued)

OTHER PUBLICATIONS

Extended European search report issued on Apr. 7, 2015 in the counterpart European patent application.
(Continued)

*Primary Examiner* — Lincoln Donovan
*Assistant Examiner* — David Mattison
(74) *Attorney, Agent, or Firm* — Marvin A. Motsenbocker; Mots Law, PLLC

(57) ABSTRACT

Two semiconductor switches are arranged in parallel in a load circuit for connecting a power source with a load. Further, the semiconductor switches are controlled so as to be alternately tuned on and off. As a result, since a current flows through only either of the semiconductor switches, an offset error detected by current sensors includes only an offset error of either of the semiconductor switches, the detection of current with high accuracy can be accomplished. Therefore, when performing the control of shutting off the circuit to cope with the occurrence of an overcurrent flowing through the load, the shutoff control with high accuracy can be accomplished.

6 Claims, 5 Drawing Sheets

(51) Int. Cl.
*H02J 1/10* (2006.01)
*H02M 1/32* (2007.01)
*H02H 3/087* (2006.01)

(56) References Cited

U.S. PATENT DOCUMENTS

2010/0149713 A1   6/2010  So
2011/0309874 A1*  12/2011 Takimoto et al. ............ 327/427

FOREIGN PATENT DOCUMENTS

| JP | H05-167409 A | 7/1993 |
| JP | H07-113826 A | 5/1995 |
| JP | 2001-310720 A | 11/2001 |

OTHER PUBLICATIONS

Japanese office action letter issued on May 11, 2015 in the counterpart Japanese patent application.

* cited by examiner

CONTROLLER FOR LOAD CIRCUIT

TECHNICAL FIELD

The present invention relates to a controller for controlling ON/OFF states of a load circuit with use of a plurality of semiconductor switches.

BACKGROUND ART

In an in-vehicle load, such as an electric motor or a lamp, driving and stopping of the load is controlled by switching ON and OFF state of a semiconductor switch, such as an FET, which is, for example, interposed between the relevant load and a battery. For a load circuit of the in-vehicle load supplied with large current, there is a proposed technique of providing a plurality of semiconductor switches connected in parallel and controlling the semiconductor switches by the same control signal, thereby dispersing the current flowing through the load circuit to reduce current flowing through each semiconductor switch and thus restricting heat generation (see PTL 1).

CITATION LIST

Patent Literature

PTL 1: JP 2001-310720A

SUMMARY OF INVENTION

In the conventional example disclosed in PTL 1, however, a bias is produced in the currents flowing through respective semiconductor switches due to variations in respective elements constituting each semiconductor switch, causing a problem that the heating value of a certain semiconductor switch may be increased.

In order to solve the above-mentioned problems, therefore, an object of the present invention is to provide a controller for a load circuit, which is capable of equalizing respective heat values of semiconductor switches connected in parallel.

In order to attain the above object, the first aspect according to the present invention provides a controller for a load circuit which connects a power source with a load, the controller includes: a plurality of semiconductor switches arranged in parallel and configured to control driving and stopping of the load by switching ON and OFF state of the semiconductor switches; current sensors provided for the semiconductor switches respectively to detect currents flowing through the semiconductor switches; and a control unit configured to output control signals to the semiconductor switches so that the semiconductor switches are turned on and off in different ON-time zones and different OFF-time zones with respect to each semiconductor switch when a drive command signal is inputted to the control unit, and configured to shut off the semiconductor switches based on the currents detected by the current sensors.

As the semiconductor switches connected in parallel are arranged in the load circuit and the ON-time zones and the OFF-time zones of the semiconductor switches are set respectively, it is possible to reduce the influence of offset errors inherent in the current sensors, allowing for the detection of currents with high accuracy. As a result, if an overcurrent flows through the load circuit, the controller can detect such a situation immediately and shut off the load circuit.

The current censors may be configured to generate reference currents proportional to the currents flowing through the semiconductor switches with use of operational amplifiers, thereby detecting the currents flowing through the semiconductor switches based on the generated reference currents.

As the current sensors include the operational amplifiers and generate the reference currents proportional to the currents flowing through the semiconductor switches with use of the operational amplifiers to detect the currents flowing through the semiconductor switches based on the generated reference currents, it is possible to improve the accuracy of detecting the currents.

The control unit may be configured to set respective ON-time zones and OFF-time zones of the semiconductor switches so that any one of the semiconductor switches is turned on.

As the semiconductor switches are controlled so that any one of them is turned on, it is possible to reduce the influence of offset errors existing in the current sensors, allowing the currents to be detected with high accuracy.

The control unit may be configured to set respective ON-time zones for the semiconductor switches in sequence and also set the ON-time zones and respective OFF-time zones of the semiconductor switches so that the ON-time zone of semiconductor switch to be turned on at this time slightly overlaps the ON-time zone of semiconductor switch to be turned on at the next time.

As the semiconductor switch to be turned on at the next time is turned on before the semiconductor switch to be turned on at this time is turned off, a slight overlapping time is present in switching the semiconductor switch to be turned on, allowing the generation of noise to be reduced.

DESCRIPTION OF EMBODIMENTS

Hereinafter, an embodiment according to the present invention will be described with reference to the drawings.

Figure 1:
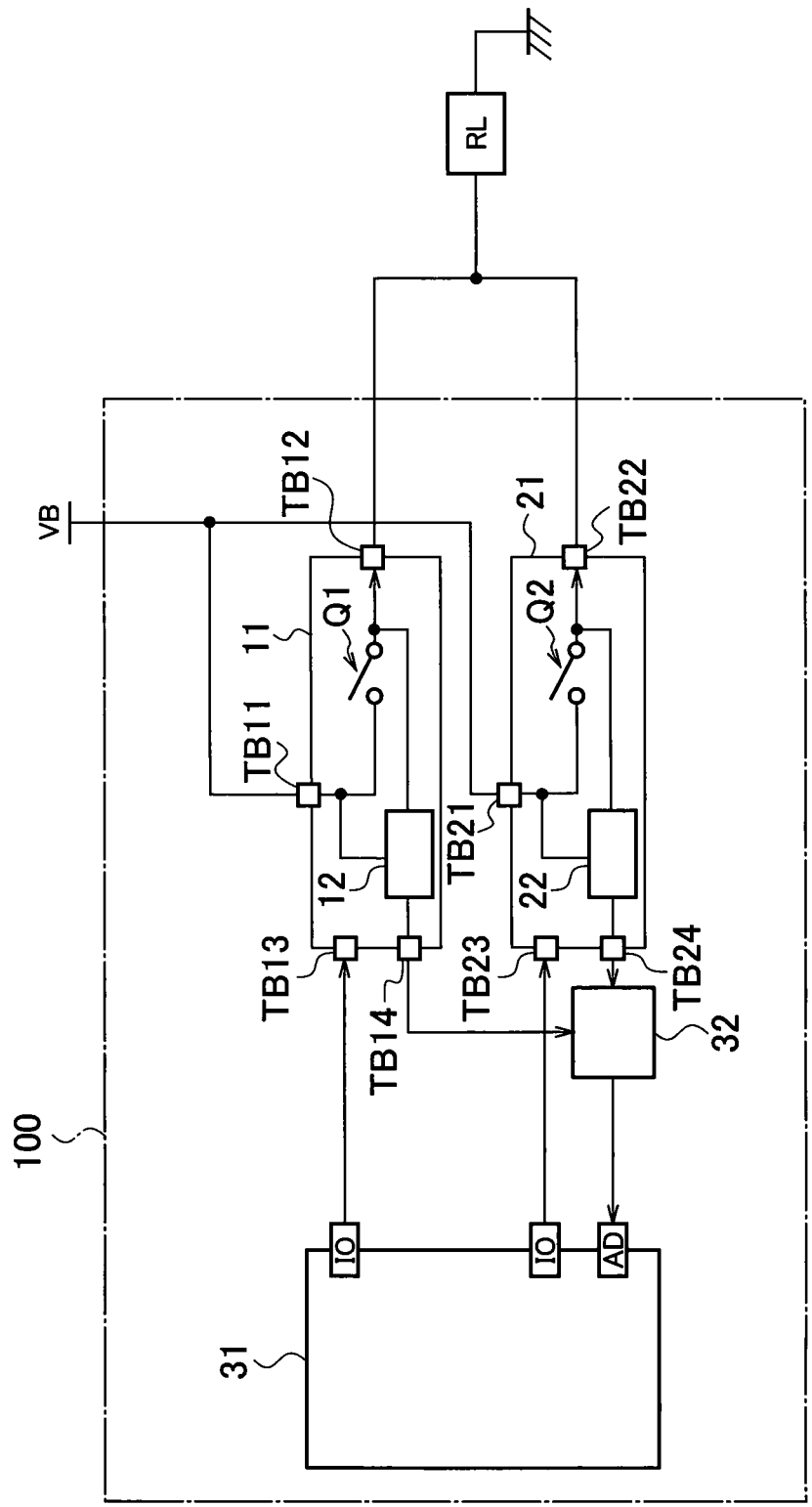
FIG. 1 is an explanatory diagram illustrating a load circuit provided with a controller according to an embodiment of the present invention.

As illustrated in FIG. 1, a controller 100 according to the embodiment is arranged between a battery VB and a load RL to control an ON/OFF state of the load RL and includes a first semiconductor switch circuit 11 and a second semiconductor switch circuit 21 each connected in parallel, a control unit 31, and an adding circuit 32.

The first semiconductor switch circuit 11 is formed by one semiconductor chip and includes a first semiconductor switch Q1 consisting of a MOSFET and a first current sensor 12 for detecting a current flowing through the first semiconductor switch Q1. A drain of the first semiconductor switch Q1 is connected to the battery VB through a terminal TB11. A source of the first semiconductor switch Q1 is connected to the load RL, such as a motor or a lamp, through a terminal TB12. A gate of the first semiconductor switch Q1 is connected to the control unit 31 through a terminal TB13 (although a connection line between TB13 and Q1 is omitted in the figure). The first current sensor 12 is connected to the adding circuit 32 through a terminal TB14.

The second semiconductor switch circuit 21 is formed by one semiconductor chip and includes a second semiconductor switch Q2 consisting of a MOSFET and a second current sensor 22 for detecting a current flowing through the second semiconductor switch Q2. A drain of the second semiconductor switch Q2 is connected to the battery VB through a terminal TB21. A source of the second semiconductor switch Q2 is connected to the load RL through a terminal TB22. A gate of the second semiconductor switch Q2 is connected to the control unit 31 through a terminal TB23 (although a connection line between TB23 and Q2 is omitted in the figure). The second current sensor 22 is connected to the adding circuit 32 through the terminal TB14. An output terminal of the adding circuit 32 is connected to the control unit 31.

Figure 2:
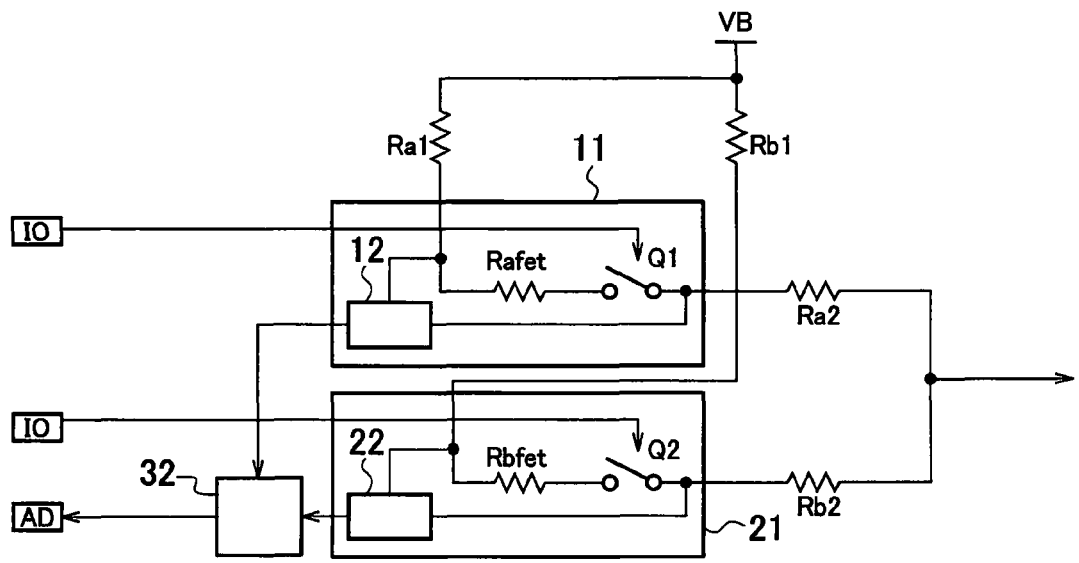
FIG. 2 is an explanatory diagram equivalently illustrating resistances existing in respective wirings of the controller according to the embodiment, also illustrating a first semiconductor switch (Q1) and a second semiconductor switch (Q2) both in OFF state.

As illustrated in FIG. 2, there exist a resistance Ra1 in a wiring (wiring between VB and TB11 of FIG. 1) connecting the battery VB with the first semiconductor switch circuit 11, a resistance Ra2 (wiring between TB12 and RL of FIG. 1) between the first semiconductor switch circuit 11 and the load RL, and an ON resistance Rafet in the first semiconductor switch Q1. Similarly, there exist a resistance Rb1 in a wiring (wiring between VB and TB21 of FIG. 1) connecting the battery VB with the second semiconductor switch circuit 21, a resistance Rb2 (wiring between TB22 and RL of FIG. 1) between the second semiconductor switch circuit 21 and the load RL, and an ON resistance Rbfet in the second semiconductor switch Q2.

Figure 6:
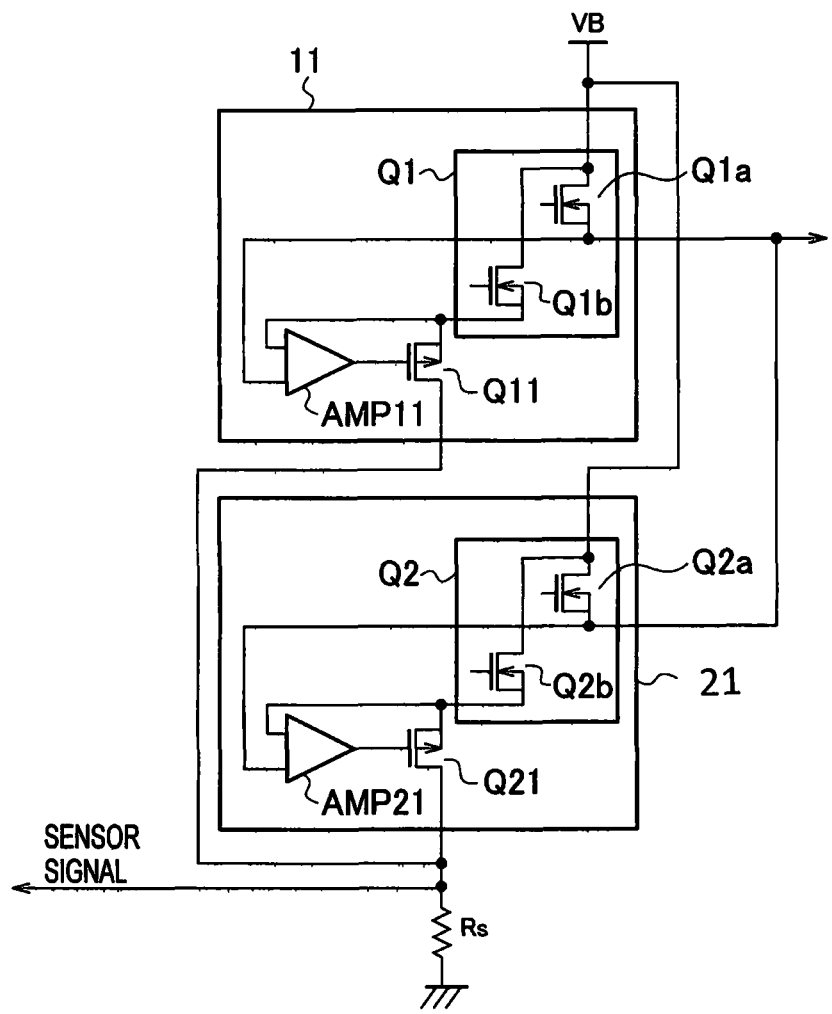
FIG. 6 is a circuit diagram illustrating the constitution of a current sensor provided in the controller according to the embodiment.

Next, the detailed constitutions of the first current sensor 12, the second current sensor 22, and the adding circuit 32 will be described with reference to the circuit diagram of FIG. 6. As illustrated in FIG. 6, the first semiconductor switch Q1 includes a multi-source FET including a first main-FET (Q1a) and a first sub-FET (Q1b). First and second branch lines are connected to the source of the first main-FET (Q1a). The first branch line of the source of the first main-FET (Q1a) is connected to the load RL via the terminal TB12 illustrated in FIG. 1. The second branch line of the source of the first main-FET (Q1a) is connected to one of input terminals of a first amplifier AMP11. Further, first and second branch lines are connected to the source of the first sub-FET (Q1b). The first branch line of the source of the first sub-FET (Q1b) is connected to a source of a third semiconductor switch Q11 consisting of a P-type MOSFET. The second branch line of the source of the first sub-FET (Q1b) is connected to the other of the input terminals of the first amplifier AMP11.

The output terminal of the first amplifier AMP11 is connected to a gate of the third semiconductor switch Q11. A drain of the third semiconductor switch Q11 is grounded via a sense resistance Rs.

The first amplifier AMP11 outputs a control signal to the gate of the third semiconductor switch Q11 so that a source voltage of the first main-FET (Q1a) becomes equal to a source voltage of the first sub-FET (Q1b). Therefore, a current flowing through the third semiconductor switch Q11 is proportional to a current flowing through the first semiconductor switch Q1.

The second semiconductor switch Q2 constitutes a multi-source FET including a second main-FET (Q2a) and a second sub-FET (Q2b). A source of the second main-FET (Q2a) is connected to one of input terminals of a second amplifier AMP21. A source of the second sub-FET (Q2b) is connected to the other of the input terminals of the second amplifier AMP21.

An output terminal of the second amplifier AMP21 is connected to a gate of a fourth semiconductor switch Q21 consisting of a P-type MOSFET. A source of the fourth semiconductor switch Q21 is connected to the second sub-FET (Q2b). A drain of the fourth semiconductor switch Q21 is grounded via the sense resistor Rs.

The second amplifier AMP21 outputs a control signal to the gate of the fourth semiconductor switch Q21 so that a source voltage of the second main-FET (Q2a) becomes equal to a source voltage of the second sub-FET (Q2b). Therefore, a current flowing through the fourth semiconductor switch Q21 is proportional to a current flowing through the second semiconductor switch Q2.

An additional current obtained by adding the current flowing through the third semiconductor switch Q11 and the current flowing through the fourth semiconductor switch Q21 (reference currents) flows through the sense resistor Rs. Therefore, by measuring a voltage between both ends of the sense resistor Rs, it is possible to measure a current flowing through the load RL. That is, the first current sensor 12 and the second current sensor 22 generate the reference currents proportional to the currents flowing through the first semiconductor switch Q1 and the second semiconductor switch Q2 with use of the operational amplifiers and then detect the currents flowing through the first semiconductor switch Q1 and the second semiconductor switch Q2, based on the generated reference currents. The sense resistor Rs corresponds to the adding circuit 32 illustrated in FIG. 1.

Based on a current Ic obtained by adding a current Ib flowing through the second semiconductor switch Q2 and a current Ia flowing through the first semiconductor switch Q1, when the current Ic exceeds a predetermined threshold value, the control unit 31 illustrated in FIG. 1 turns off the first semiconductor switch Q1 and the second semiconductor switch Q2 to shut off the load circuit, executing a control to protect whole of the circuit. Alternatively, the control unit 31 estimates a wire temperature of the load circuit on the basis of the current Ic. Then, when the estimated temperature exceeds a threshold value, the control unit 31 shuts off the load circuit to execute a control to protect whole of the circuit from overheating.

According to the embodiment, by switching respective ON/OFF states of the first semiconductor switch Q1 and the second semiconductor switch Q2 alternately, a bias in the currents flowing through the first semiconductor switch Q1 and the second semiconductor switch Q2 is restrained since one of these switches Q1 and Q2 is tuned on while turning off the other one. Next, the bias in the currents will be described in both cases: the first semiconductor switch Q1 and the second semiconductor switch Q2 are simultaneously turned on to drive the load RL (in the conventional method); and the first semiconductor switch Q1 and the second semiconductor switch Q2 are alternately turned on/off to drive the load RL (in the embodiment), below.

Case of Simultaneously Turning on First Semiconductor Switch Q1 and Second Semiconductor Switch Q2

First, we now describe the operation in a case that the current flowing through the load RL is dispersed to the first semiconductor switch circuit 11 and the second semiconductor switch circuit 21 by simultaneously turning on the first semiconductor switch Q1 and the second semiconductor switch Q2. According to an equivalent circuit illustrated in FIG. 2, a resistance of the circuit through the first semiconductor switch circuit 11 (referred to as "Ra") can be represented by the following equation (1):

$$Ra = Ra1 + Rafet + Ra2. \tag{1}$$

Similarly, a resistance of the circuit through the second semiconductor switch circuit 21 (referred to as "Rb") can be represented by the following equation (2):

$$Rb = Rb1 + Rbfet + Rb2. \tag{2}$$

Figure 3:
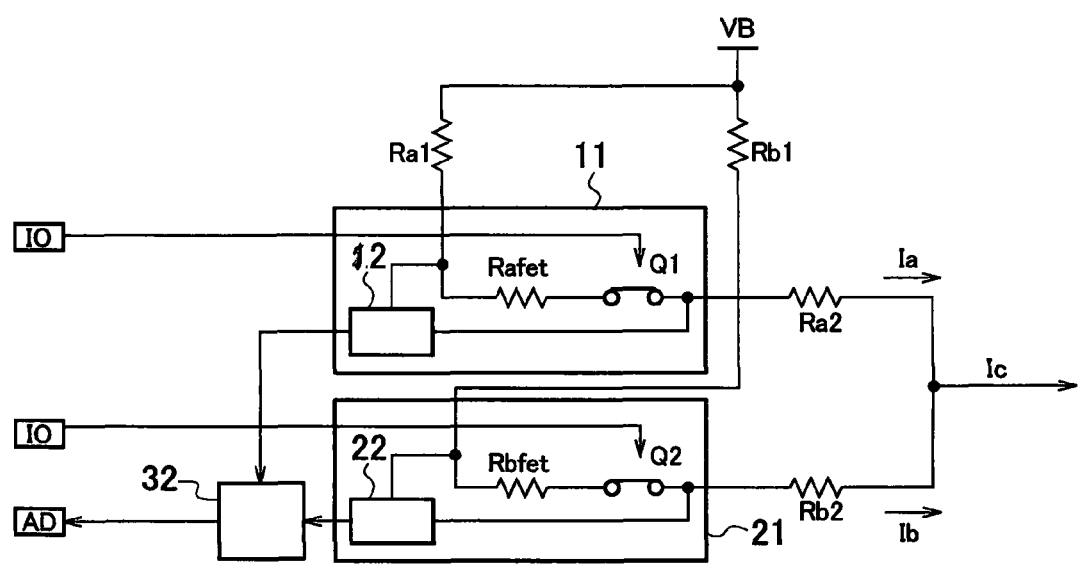
FIG. 3 is an explanatory diagram equivalently illustrating the resistances existing in respective wirings of the controller of the embodiment, also illustrating the first semiconductor switch (Q1) and the second semiconductor switch (Q2) both in ON state.

Accordingly, as illustrated in FIG. 3, when simultaneously turning on the first semiconductor switch Q1 and the second semiconductor switch Q2, the current Ia flows through the first semiconductor switch circuit 11, while the current Ib flows through the second semiconductor switch circuit 21. As the ratio of the current Ia to the current Ib (i.e. Ia/Ib) is equal to the reciprocal ratio of resistances, the equality of "Ia/Ib=Rb/Ra" is realized.

At this time, unless an offset error between the first amplifier AMP11 and the second amplifier AMP21 is present, the first current sensor 12 and the second current sensor 22 of FIG. 6 will detect a voltage Vafet between both ends of the first semiconductor switch Q1 in the expression of "Vafet=Rafet×Ia" and a voltage Vbfet between both ends of the second semiconductor switch Q2 in the expression of "Vbfet=Rbfet×Ia". However, in fact, since the fact of the matter is that offset errors Vaoffset and Vboffset are present in the first amplifier AMP11 and the second amplifier AMP21, respective voltages Vafet and Vbfet will be detected as represented with the following equations (3) and (4):

$$Vafet = Rafet \times Ia + Vaoffset, \tag{3}$$

$$Vbfet = Rbfet \times Ib + Vboffset. \tag{4}$$

Thus, respective measurement values Iasens, Ibsens of the currents Ia, Ib will be detected by the following equations (5), (6):

$$Iasens = (Vafet/Rafet) = Ia + Vaoffset/Rafet, \tag{5}$$

$$Ibsens = (Vbfet/Rbfet) = Ib + Vboffset/Rbfet. \tag{6}$$

If the current flowing through the load RL is represented by Ic, the measurement value Icsens is detected, with the following equation (7) obtained by adding the equation (6) to the equation (5), as follows:

$$Icsens = Ic + Vaoffset/Rafet + Vboffset/Rbfet. \tag{7}$$

As can be seen from the equation (7), if applying current to the load RL by simultaneously turning on the first semiconductor switch Q1 and the second semiconductor switch Q2, the offset error components of the first current sensor 12 and the second current sensor 22 will be added to the current Ic to be measured inherently. Additionally, from the equation (7), it is noted that the smaller respective values of the resistances Rafet, Rbfet get, the larger the influence of the offset errors (on the current Ic) becomes. Therefore, if making the values of the resistances Rafet, Rbfet smaller in order to suppress heat generation of the first semiconductor switch Q1 and the second semiconductor switch Q2, that is, Joule heating "Rafet×Ia$^2$+Rbfet×Ib$^2$", the influence of the offset errors will be enhanced furthermore.

Case of Alternately Turning on First Semiconductor Switch Q1 and Second Semiconductor Switch Q2

Figure 7:
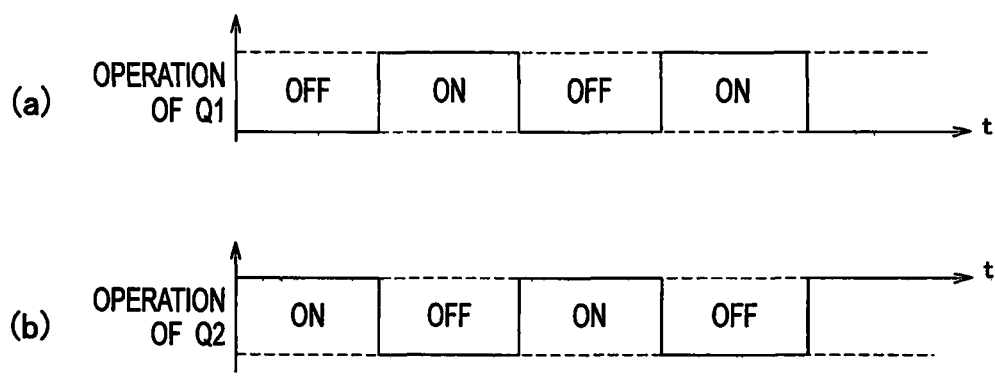
FIG. 7 is a timing chart illustrating ON-time zones and OFF-time zones of respective semiconductor switches of the controller according to the embodiment.

Next, we describe the operation in a case that the load RL is supplied with current by alternately turning on the first semiconductor switch Q1 and the second semiconductor switch Q2. In this case, the first semiconductor switch Q1 and the second semiconductor switch Q2 are controlled in a manner that when the first semiconductor switch Q1 is being turned on, the second semiconductor switch Q2 is within an OFF time zone and that when the first semiconductor switch Q1 is being turned off, the second semiconductor switch Q2 is within an ON time zone, as illustrated in FIG. 7.

Figure 4:
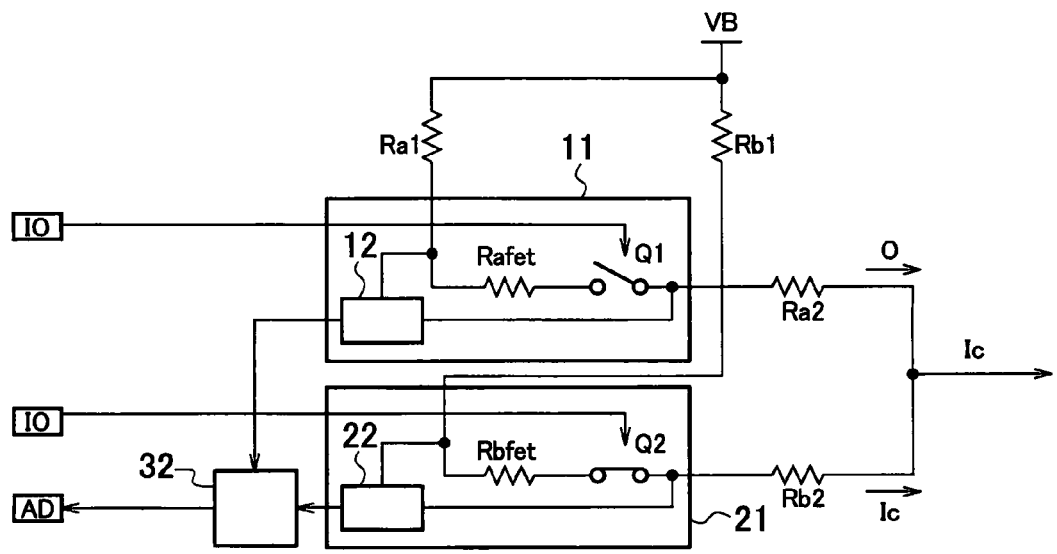
FIG. 4 is an explanatory diagram equivalently illustrating the resistances existing in respective wirings of the controller according to the embodiment, also illustrating the first semiconductor switch (Q1) in the OFF state and the second semiconductor switch (Q2) in the ON state.
Figure 5:
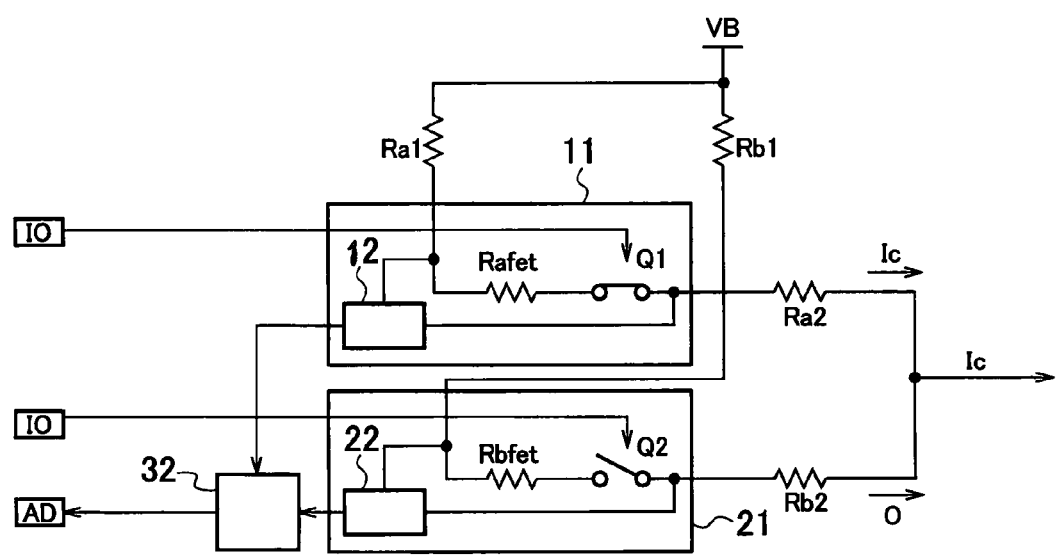
FIG. 5 is an explanatory diagram equivalently illustrating the resistances existing in respective wirings of the controller according to the embodiment, also illustrating the first semiconductor switch (Q1) in the ON state and the second semiconductor switch (Q2) in the OFF state.

Then, the measurement value Icsens of the current Ic flowing through the load RL is represented by the following equation (8) when the first semiconductor switch Q1 is turned on (see FIG. 5), and also represented by the following equation (9) when the second semiconductor switch Q2 is turned on (see FIG. 4).

$$Icsens = Ic + Vaoffset/Rafet, \tag{8}$$

$$Icsens = Ic + Vboffset/Rbfet. \tag{9}$$

From the equations (8) and (9), it is found that when alternately operating the first semiconductor switch Q1 and the second semiconductor switch Q2, only the error of one current sensor is generated.

Thus, it is understood that turning on either one of the semiconductor switches only enables the influence of the offset errors possessed by the amplifiers to be reduced.

Further, as it is not necessarily a case that the first semiconductor switch Q1 has the same ON-resistance as that of the second semiconductor switch Q2, there may occur a bias in the heat value of respective semiconductor switches, provided that the ON-time zones of the first semiconductor switch Q1 and the second semiconductor switch Q2 and their OFF-time zones are established uniformly, causing a problem that a temperature rising of either semiconductor switch gets larger.

According to the embodiment, it is carried out to control the ON-time zone and the OFF-time zone depending on the easiness of being elevated in temperature of each semiconductor switch so that the temperature of the first semiconductor switch Q1 is equalized to that of the second semiconductor switch Q2. Specifically, the ON-time zone is set shorter for the semiconductor switch which is easy to be elevated in its temperature. Conversely, the ON-time zone is set longer for the semiconductor switch which is hard to be elevated in its temperature.

As for the judgment whether the temperature is easy to be elevated or not, there may be adopted a variety of methods of: using theoretical values of electric and thermal resistances of the semiconductor switches; picking up actual measurements of samples after designing a substrate, and subsequently judging the easiness based on the actual measurements picked up; measuring the degree of temperature rising with respect to each product at an inspection before shipment; and so on.

Figure 8:
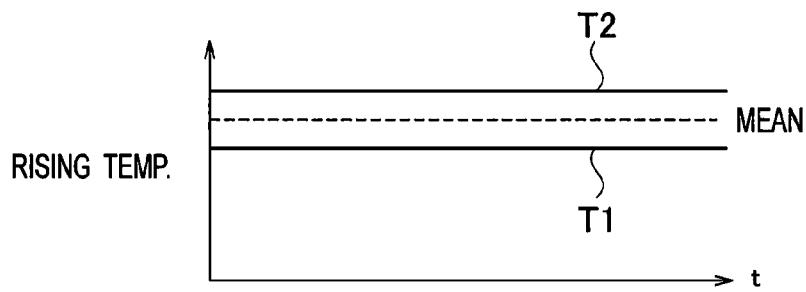
FIG. 8 is a characteristics diagram illustrating temperature rising of respective semiconductor switches of the controller according to the embodiment.
Figure 9:
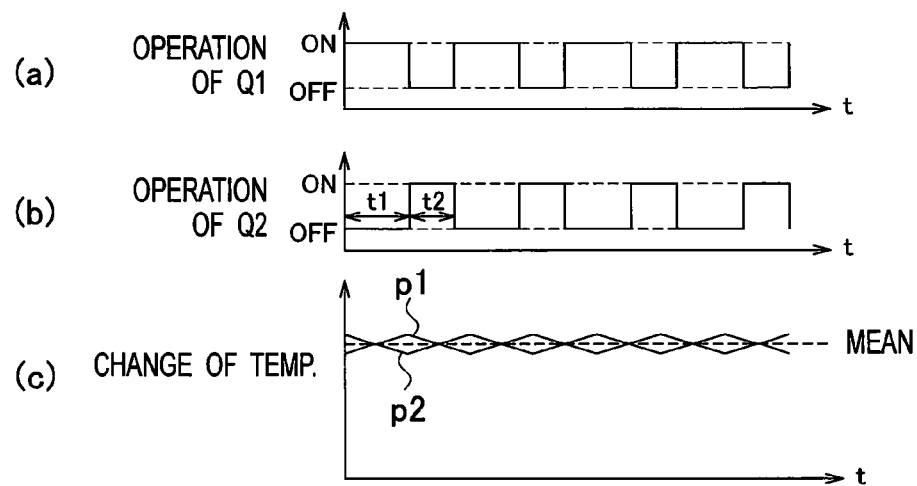
FIG. 9 is a timing chart illustrating ON-time zones, OFF-time zones and temperature changes of respective semiconductor switches when their ON/OFF times are appropriately established in the controller according to the embodiment.

For example, as illustrated in FIG. 8, if the temperature of the first semiconductor switch Q1 becomes T1 while the temperature of the second semiconductor switch Q2 becomes T2 higher than T1 as a result of energizing for a given period of time, the temperatures of the first semiconductor switch Q1 and the second conductor switch Q2 are uniformized by setting the ON-time of the first semiconductor switch Q1 to t1, while setting the ON-time of the second semiconductor switch Q2 to t2 (t2<t1), as illustrated in FIGS. 9(a) and 9(b). Specifically, as illustrated in FIG. 9(c), the temperature of the first semiconductor switch Q1 changes with a repetition of temperature rise-fall illustrated with a curve p1, while the temperature of the second semiconductor switch Q2 changes with a repetition of temperature rise-fall illustrated with a curve p2. Consequently, as respective temperatures will converge on a mean of the temperatures T1 and T2, it is possible to equalize the temperatures of the first semiconductor switch Q1 and the second conductor switch Q2.

Thus, in the controller 100 for the load circuit according to the embodiment, the first semiconductor switch Q1 and the second semiconductor switch Q2 are arranged in parallel with each other and also controlled so that either of them is turned on. Therefore, even when the offset errors are present in both the first amplifier AMP11 of the first current sensor 12 and the second amplifier AMP21 of the second current sensor 22, it is possible to reduce the influence of the offset errors. For this reason, the controller is capable of detecting currents with high accuracy. Accordingly, when performing the control of shutting off the first semiconductor switch circuit 11 and the second semiconductor switch circuit 21 based on the detected current values, the cutoff control with high accuracy can be accomplished.

Further, even if there exist variations in the ON-resistances of the first semiconductor switch Q1 and the second semiconductor switch Q2, it becomes possible to equalize the temperature of the whole device by appropriately setting the ON-time zones and the OFF-time zones of the first semiconductor switch Q1 and the second semiconductor switch Q2.

DESCRIPTION OF MODIFICATION

Figure 10:
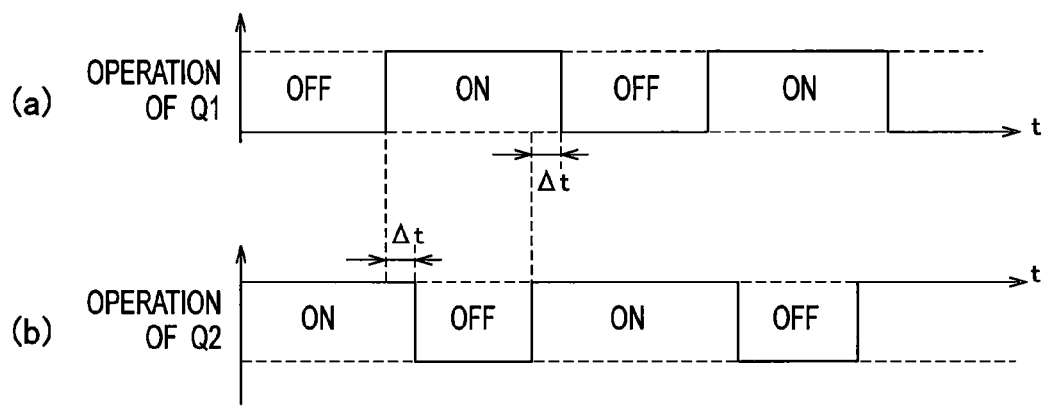
FIG. 10 is a timing chart illustrating ON-time zones and OFF-time zones of respective semiconductor switches of a controller according to a modification of the embodiment.

Next, a modification of the above-mentioned embodiment will be described. In the above-mentioned embodiment, as illustrated in FIG. 7, the operations of the semiconductor switches are controlled so that one semiconductor switch is turned on while the other semiconductor switch is being turned off. According to the modification, as illustrated in FIGS. 10(a) and 10(b), the operations of the semiconductor switches are controlled so that the timing of switching the first semiconductor switch Q1 from its OFF state to the ON state slightly precedes the timing of switching the second semiconductor switch Q2 from its ON state to the OFF state by a time Δt. That is, a slight overlapping period of time is provided between respective ON-time zones of both semiconductor switches.

According to such a constitution, it is possible to reduce noise at the time of switching on/off respective semiconductor switches.

Hereinabove, the controller for the load circuit of the present invention has been described on the basis of the illustrated embodiment. However, the present invention is not limited to the embodiment only, and the constitutions of respective parts may be replaced with any constitutions having similar functions respectively.

In the above-mentioned embodiment, for instance, we have described one example of connecting the first semiconductor switch circuit 11 and the second semiconductor switch circuit 21 in parallel and controlling the operations so that the first semiconductor switch Q1 and the second semiconductor switch Q2 are turned on alternately. However, the present invention is not limited to this, and the similar effect as above could be accomplished by an arrangement where three or more semiconductor switch circuits are provided, and semiconductor switches of respective semiconductor switch circuits are turned-on in sequence.

INDUSTRIAL APPLICABILITY

The present invention is available to prevent a bias of current in case of driving a load with use of a plurality of semiconductor switches.

The invention claimed is:

1. A controller for a load circuit which connects a power source with a load, comprising:
   a plurality of semiconductor switches arranged in parallel and configured to control driving and stopping of the load by switching ON and OFF state of the semiconductor switches;
   a plurality of current sensors, where each current sensor corresponds to a respective one of the plurality of semiconductor switches, to detect currents flowing through the semiconductor switches; and
   a control unit configured to output control signals to the semiconductor switches so that the semiconductor switches are turned on and off in different ON-time zones and different OFF-time zones with respect to each semiconductor switch when a drive command signal is inputted to the control unit, and configured to shut off the semiconductor switches based on the currents detected by the current sensors; and
   an adding circuit configured to add the currents detected by the current sensors,
   wherein each of the semiconductor switches comprises a first transistor and a second transistor,
   wherein each of the current sensors comprises an operational amplifier and a third transistor, each current sensor configured to generate a reference current proportional to the current flowing through the respective semiconductor switch by way of the operational amplifier, thereby detecting the reference current flowing through the respective semiconductor switch based on the generated reference current,
   wherein the operational amplifier provided for each of the current sensors has a first input port connected to a source of the first transistor, a second input port connected to a source of the second transistor, and an output port connected to a gate of the third transistor, and
   wherein a source of the third transistor of a corresponding one of the current sensors is connected to the source of the first transistor of a corresponding one of the semiconductor switches.

2. The controller according to claim 1, wherein
   the control unit is configured to set respective ON-time zones and OFF-time zones of the semiconductor switches so that only one of the semiconductor switches is turned on in sequence.

3. The controller according to claim 1, wherein
the control unit is configured to set respective ON-time zones for the semiconductor switches in sequence and also set the ON-time zones and respective OFF-time zones of the semiconductor switches so that the ON-time zone of semiconductor switch to be turned on at this time overlaps the ON-time zone of semiconductor switch to be turned on at the next time.

4. The controller according to claim 1, wherein each of the semiconductor switches comprises a same type of transistor.

5. The controller according to claim 4, wherein the same type of transistor provided in each of the semiconductor switches is a field effect transistor (FET).

6. The controller according to claim 1, wherein the plurality of transistors are each field effect transistors (FETs).

\* \* \* \* \*